United States Patent
Ware et al.

(10) Patent No.: US 11,264,085 B1
(45) Date of Patent: Mar. 1, 2022

(54) MEMORY COMPONENT FOR DEPLOYMENT IN A DYNAMIC STRIPE WIDTH MEMORY SYSTEM

(71) Applicant: Rambus Inc., San Jose, CA (US)

(72) Inventors: Frederick A. Ware, Los Altos Hills, CA (US); John Eric Linstadt, Palo Alto, CA (US); Kenneth L. Wright, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 16/927,892

(22) Filed: Jul. 13, 2020

Related U.S. Application Data

(63) Continuation of application No. 15/992,100, filed on May 29, 2018, now Pat. No. 10,734,064, which is a
(Continued)

(51) Int. Cl.
| | |
|---|---|
| *G11C 11/4093* | (2006.01) |
| *G06F 13/16* | (2006.01) |
| *G11C 11/4076* | (2006.01) |
| *G11C 11/4091* | (2006.01) |
| *G06F 12/14* | (2006.01) |
| *G11C 11/408* | (2006.01) |
| *G11C 11/4072* | (2006.01) |
| *G11C 29/38* | (2006.01) |

(Continued)

(52) U.S. Cl.
CPC ...... *G11C 11/4093* (2013.01); *G06F 12/1433* (2013.01); *G06F 13/1673* (2013.01); *G06F 13/1678* (2013.01); *G11C 7/1072* (2013.01); *G11C 11/408* (2013.01); *G11C 11/4072* (2013.01); *G11C 11/4076* (2013.01); *G11C 11/4091* (2013.01); *G11C 29/22* (2013.01); *G11C 29/32* (2013.01); *G11C 29/38* (2013.01); *G06F 2212/1052* (2013.01); *G11C 5/04* (2013.01)

(58) Field of Classification Search
None
See application file for complete search history.

(56) References Cited

U.S. PATENT DOCUMENTS

| | | | |
|---|---|---|---|
| 4,120,048 A | 10/1978 | Fuhrman | |
| 4,335,459 A | 6/1982 | Miller | |

(Continued)

OTHER PUBLICATIONS

Elpida, "How to Use SDRAM User's Manual", Document No. E0123N80 (Ver. 8.0) published Aug. 2007, Japan, pp. 1-118. 118 pages.

*Primary Examiner* — James G Norman
(74) *Attorney, Agent, or Firm* — Charles Shemwell

(57) ABSTRACT

In a memory component having a page buffer with $2^N$ independently accessible regions, N bits of a command/address value are decoded to access contents within a first one of the $2^N$ page-buffer regions if a configuration value specifies a first addressing resolution and, if the configuration value specifies a second addressing resolution, a composite address that includes fewer than N bits of the command/address value together with a plurality of bits generated within the memory component to access contents within a second one of the $2^N$ page-buffer regions.

20 Claims, 10 Drawing Sheets

Related U.S. Application Data continuation of application No. 15/285,974, filed on Oct. 5, 2016, now Pat. No. 9,997,233.

(60) Provisional application No. 62/238,867, filed on Oct. 8, 2015.

(51) Int. Cl.
*G11C 29/32* (2006.01)
*G11C 29/22* (2006.01)
*G11C 7/10* (2006.01)
*G11C 5/04* (2006.01)

(56) References Cited

U.S. PATENT DOCUMENTS

| | | | |
|---|---|---|---|
| 4,412,313 A | 10/1983 | Ackland et al. | |
| 4,413,339 A | 11/1983 | Riggle et al. | |
| 4,509,172 A | 4/1985 | Chen | |
| 4,661,955 A | 4/1987 | Arlington et al. | |
| 4,663,735 A | 5/1987 | Novak et al. | |
| 4,862,463 A | 8/1989 | Chen | |
| 4,951,246 A | 8/1990 | Fromm et al. | |
| 5,020,060 A | 5/1991 | Murai et al. | |
| 5,307,356 A | 4/1994 | Fifield | |
| 5,893,927 A * | 4/1999 | Hovis | G11C 7/1006 711/171 |
| 5,896,404 A | 4/1999 | Kellogg et al. | |
| 5,966,724 A | 10/1999 | Ryan | |
| 6,341,362 B1 | 1/2002 | Golnabi | |
| 6,662,291 B2 | 12/2003 | Hashimoto et al. | |
| 6,769,050 B1 | 7/2004 | Ware et al. | |
| 6,826,663 B2 | 11/2004 | Perego et al. | |
| 6,889,304 B2 | 5/2005 | Perego et al. | |
| 7,526,597 B2 | 4/2009 | Perego et al. | |
| 7,610,447 B2 | 10/2009 | Perego et al. | |
| 7,644,347 B2 | 1/2010 | Alexander et al. | |
| 7,962,540 B2 | 6/2011 | Michaels et al. | |
| 8,069,379 B2 | 11/2011 | Perego et al. | |
| 8,139,764 B2 | 3/2012 | Chester et al. | |
| 8,335,973 B2 | 12/2012 | Abe | |
| 8,363,830 B2 | 1/2013 | Michaels et al. | |
| 8,411,853 B2 | 4/2013 | Filseth et al. | |
| 8,904,260 B2 | 12/2014 | Tran et al. | |
| 9,997,233 B1 | 6/2018 | Ware et al. | |
| 2002/0172081 A1 | 11/2002 | Mukaida et al. | |
| 2004/0186956 A1 | 9/2004 | Perego et al. | |
| 2007/0008763 A1 | 1/2007 | Choi | |
| 2011/0309525 A1 | 12/2011 | Nasu et al. | |
| 2012/0233484 A1 | 9/2012 | Rossi | |
| 2014/0173238 A1 | 6/2014 | Ware et al. | |
| 2014/0185352 A1 | 7/2014 | Chow et al. | |
| 2014/0208156 A1 | 7/2014 | Muralimanohar et al. | |
| 2014/0237261 A1 | 8/2014 | Diep et al. | |

\* cited by examiner

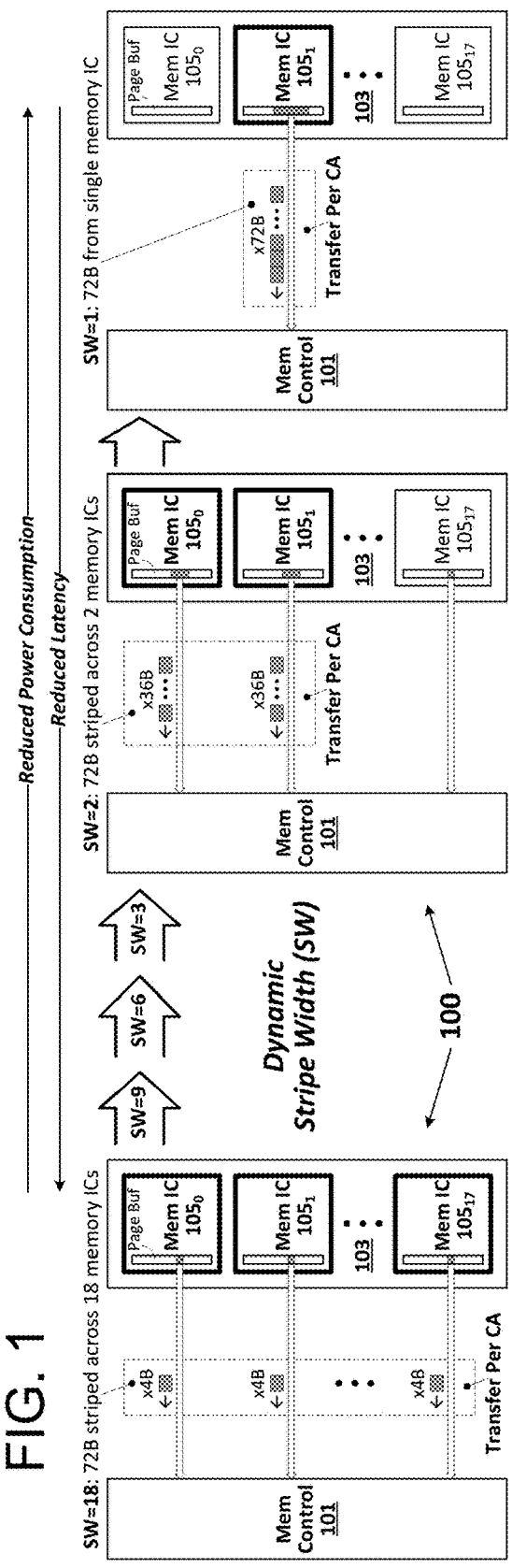
FIG. 1
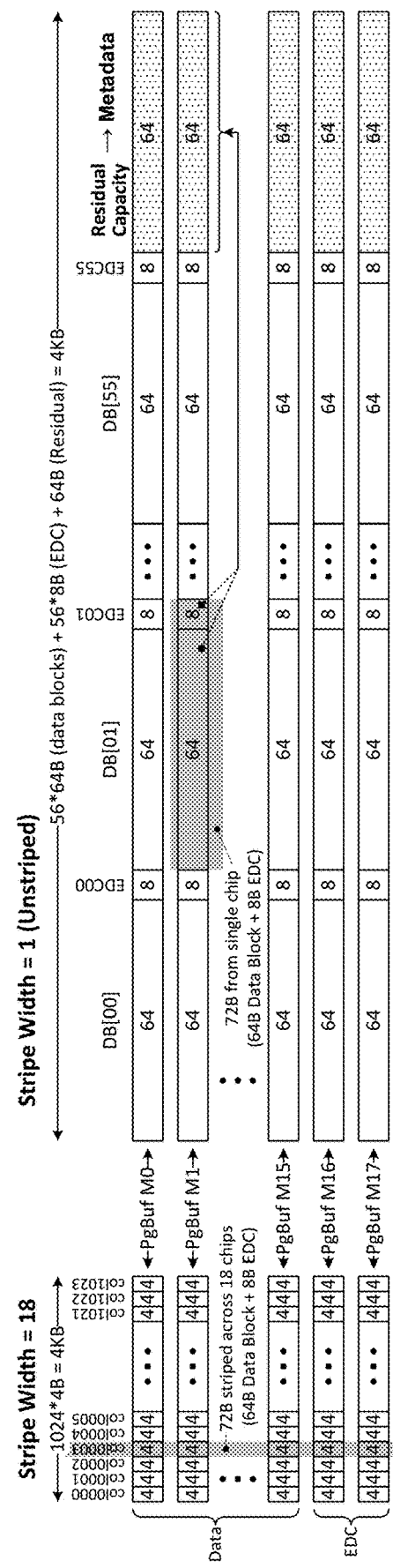
FIG. 2 Residual Capacity Devoted to Metadata

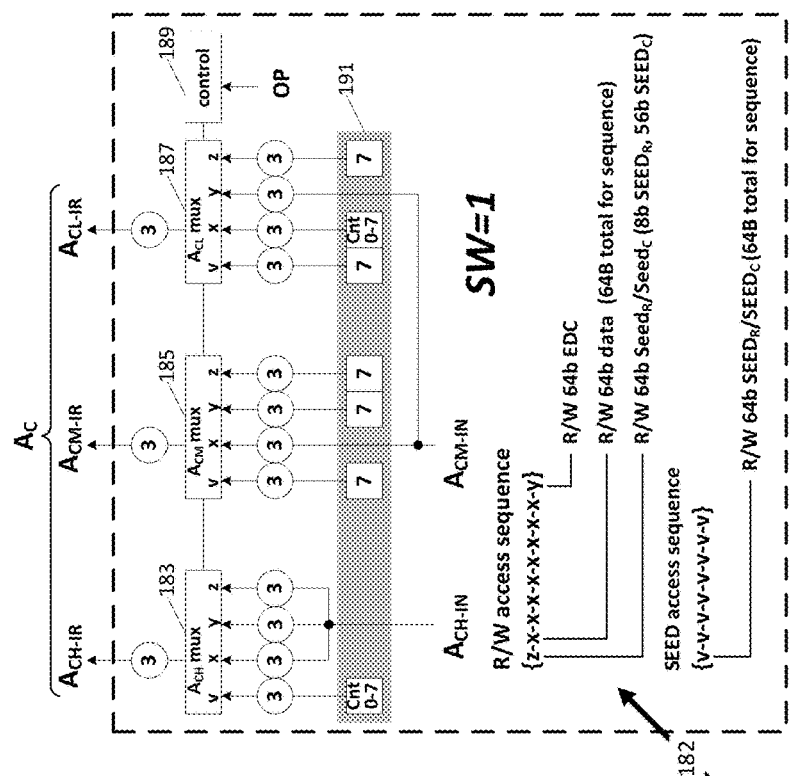
FIG. 5
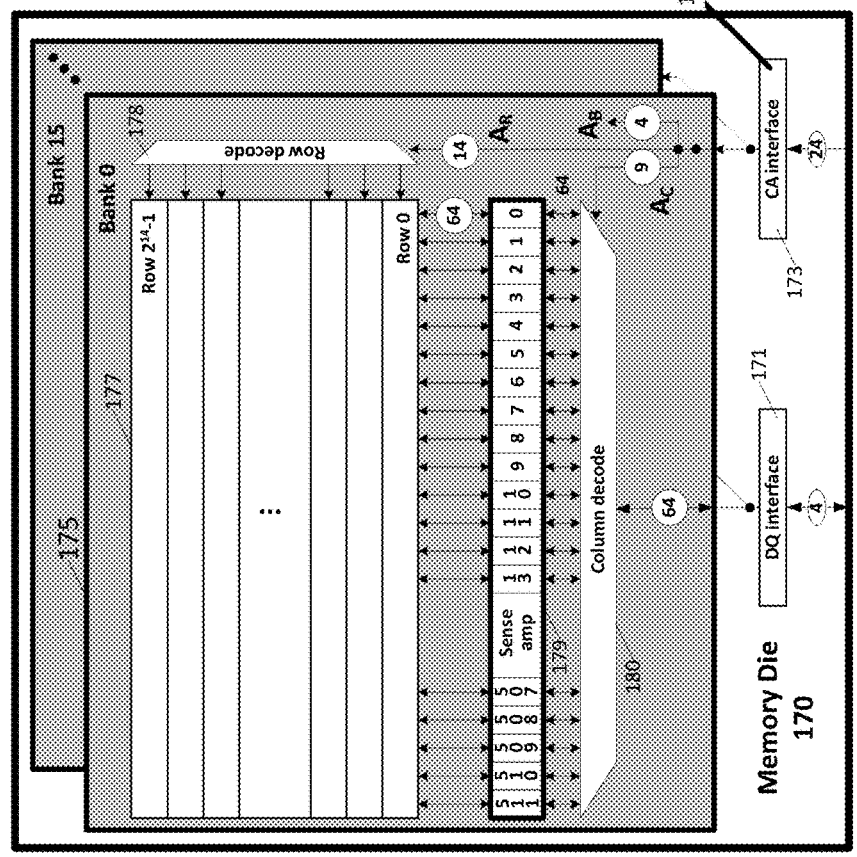
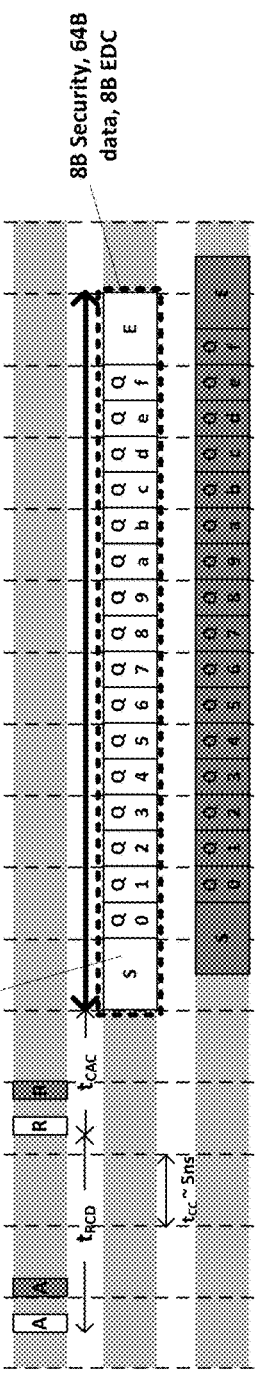
FIG. 6

MEMORY COMPONENT FOR DEPLOYMENT IN A DYNAMIC STRIPE WIDTH MEMORY SYSTEM

CROSS REFERENCE TO RELATED APPLICATIONS

This application is a continuation of U.S. patent application Ser. No. 15/992,100 filed May 29, 2018 (now U.S. Pat. No. 10,734,064), which is a continuation of U.S. patent application Ser. No. 15/285,974 filed Oct. 5, 2016 (now U.S. Pat. No. 9,997,223), which claims priority to U.S. Provisional Application No. 62/238,867 filed Oct. 8, 2015. Each of the above-referenced patent applications is hereby incorporated by reference.

TECHNICAL FIELD

The present invention relates generally to the field of data processing and more particularly to data storage and retrieval.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 illustrates an embodiment of a memory system having a stripe-width configurable memory control component and stripe-width configurable memory module;

FIG. 2 contrasts the memory page allocation in the x18 and x1 stripe width configurations of FIG. 1, illustrating the residual capacity incurred by the x1 stripe-width configuration of FIG. 1 and devotion/allocation of that otherwise unusable storage for metadata purposes;

FIG. 5 illustrates an embodiment of a memory die that may be used to implement each of the individual memory dies shown in FIG. 1 and that includes programmable and/or command-controllable address decode logic for accessing data, EDC and security information (or other metadata) in accordance with various stripe-width configurations;

FIG. 6 illustrates exemplary command/address signaling and read-data transfer for two x1 stripe-width memory access transactions directed to respective instances of the memory die shown in FIG. 5;

DETAILED DESCRIPTION

Figure 3:
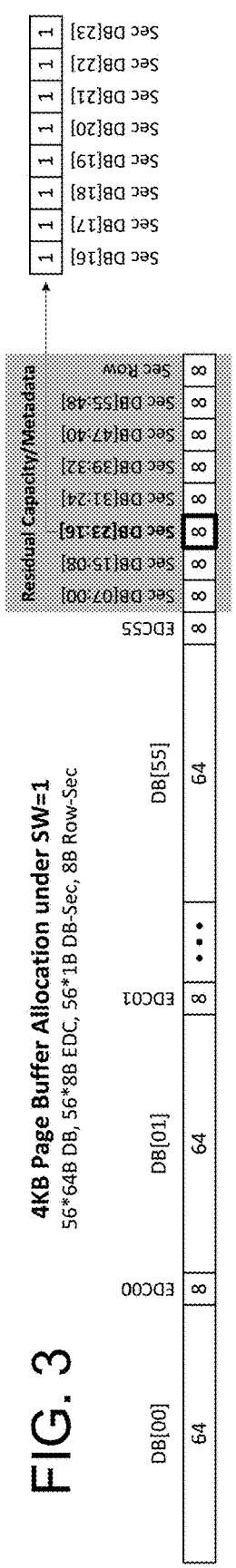
FIG. 3 illustrates an exemplary data storage format in which residual capacity in a below-maximum stripe-width configuration (x1 stripe width in this case) is allocated to storage of security metadata.

A memory module that enables a configurable number of constituent memory dies to respond to memory access commands and thereby stripe memory read and write transactions across a run-time selectable number of memory dies is disclosed in various embodiments herein, together with memory controller embodiments for configuring and interacting with such memory modules. The run-time configurable stripe width permits power and latency to be traded for one another, for example, by narrowing the stripe width (i.e., reducing the number of devices that respond per command) to conserve power at the cost of increased latency and, conversely, increasing the stripe width where low-latency memory performance is more critical.

In a number of embodiments, on-module memory components are implemented with circuitry that enables single-component stripe width configurations, while in other embodiments the available stripe width configurations are more limited (e.g., three-memory-die minimum stripe width) to enable memory modules to be populated with commercially available memory components. In other embodiments, certain stripe width configurations and transaction data sizes yield residual storage capacity that is exploited for metadata, including optional security information storage, cache-tag storage, etc. In yet further embodiments, error detection/correction (EDC) codes are extended to enable detection and correction of errors within metadata prepended, appended or otherwise included in memory-access data transfers and/or to enable detection and correction of errors within address values transmitted in association with memory access commands. These and other features and embodiments are discussed in greater detail below.

FIG. 1 illustrates an embodiment of a memory system 100 having a stripe-width configurable memory control component 101 and stripe-width configurable memory module 103. In the particular example shown, memory module 103 includes one or more "ranks" of memory dies with each such memory rank being constituted by 18 memory dies, $105_0$-$105_{17}$. Herein, the term "rank" or "memory rank" refers to the superset of memory dies that may be selected, as a group, to respond in parallel to a given memory access command, with each selected memory die receiving or outputting a respective fraction of the overall data volume (or data block) being transferred between the memory control component and memory module in association with the command. The exemplary memory module shown in FIG. 1, for instance, includes at least two x18 memory ranks (i.e., each rank including 18 memory devices, with only one rank depicted) disposed as respective inline rows of memory components on opposite sides of a memory module substrate to form a dual inline memory module (DIMM).

In a number of embodiments, the stripe width of an individual memory rank may be programmatically configured independently of stripe width configurations of other memory ranks. Alternatively, all memory ranks or any subgroup thereof may operate in accordance with a shared stripe width configuration (e.g., single programmed stripe-width value sets stripe width for all memory ranks or any subgroup of two or more memory ranks). Moreover, in some embodiments, stripe width configurations available (or programmatically made available) in one or more memory ranks may be unavailable in one or more other memory ranks and vice-versa. Beyond these rank configurability distinctions (i.e., shared or independent stripe-width configurability, and non-uniform available stripe-width configurations), stripe-width configuration may be viewed as an intra-rank configuration. That is, within a rank of N memory dies, stripe widths may be selected to enable collections of fewer than N of the dies to participate in memory read and write transactions. Accordingly, in FIG. 1 and other figures below, a single stripe-width-configurable memory rank is depicted with respect to memory module 103. In all cases, one or more additional stripe-width configurable memory ranks may be implemented on the subject memory module.

Continuing with FIG. 1, the stripe width configuration of a given memory rank effectively defines groups (or sub-ranks or logical ranks) of one or more memory dies within the larger superset that may be exclusively selected to respond to a given memory access command. In general, the widest stripe width configuration constitutes the memory rank itself while, in at least in some embodiments, the smallest stripe width configuration resolves to a single memory die. Also, in a number of implementations, the available stripe widths are limited to divisors of the number of memory dies per rank so that a given stripe width configuration resolves the memory rank into one or more sub-ranks constituted by a uniform number of (and mutually exclusive sets of) memory dies. The 18-die memory rank shown in FIG. 1, for example, may be configured for stripe width=18 (the entire memory rank), stripe width=9 (two sub-ranks constituted by respective sets of 9 dies), stripe width=6 (three sub-ranks constituted by respective sets of 6 dies), stripe width=3 (six sub-ranks constituted by respective sets of 3 dies), stripe width=2 (nine sub-ranks constituted by respective pairs of dies) and stripe width=1 (18 sub-ranks each constituted by a respective single memory die–also referred to herein as an un-striped or single-stripe configuration).

In each stripe-width configuration, individual command/address ("CA") values output from control component 101 to memory module 103 trigger corresponding data reception or transmission operations that are "striped" across the memory dies of a selected sub-rank. That is, each memory die within the selected sub-rank receives or transmits a respective component of the memory write data or read data. As a matter of terminology, each command/address value (and any associated control information) and associated data transfer are referred to collectively as a memory access transaction, and the transferred data set (or transaction data volume) may itself include separate host data and metadata components. Host data generally includes write data supplied by or read data requested by a "host" memory access requestor (e.g., a processor core or, less directly, a process or thread instantiated by program code execution within one or more processor cores), while metadata constitutes information that, despite relation to the host data, is not necessarily supplied by nor returned to the host. In the embodiment of FIG. 1 and others discussed below, for instance, metadata includes error detection and correction (EDC) codes that are algorithmically generated based on the host data and permit detection and possible correction of errors that may occur within the host data during transit and/or storage. In a number of implementations, for example, one four bit code symbol enables single symbol error detection and correction or double-symbol error detection within a corresponding set of eight four-bit host data symbols (i.e., 32 bits in all), thus effecting a 9:8 ratio between the transferred data set and the host data, the latter being referred to as "payload" data as it represents the information of interest to the host requestor.

For purposes of example in FIG. 1, the data transfer in each memory access transaction is assumed to include, as the payload data, a 64 byte data block (or cache line) in combination with at least eight bytes of EDC codes and thus a 72 byte transaction data volume. Accordingly, in the x18 stripe width configuration, all eighteen memory dies $105_0$-$105_{17}$ within the depicted memory rank transmits or receives (in read or write memory access transactions, respectively) a respective four-byte fragment of the transaction data volume. Because each memory die $105_i$ ('i' denoting 0-17) is coupled to memory control component 101 by a respective set of data signaling links, the eighteen four-byte (4B) transaction data fragments may be transmitted or received as parallel bursts (i.e., simultaneous or concurrent transfers). For purposes of example herein, each of the memory dies is assumed to have a four-bit wide data signaling interface and thus may transmit or receive a respective four-byte data fragment over a sequence of eight bit-intervals (burst length=8). In one implementation, the eight bytes of EDC codes are transmitted or received in respective four-byte fragments by memory dies 16 and 17, though those codes could alternatively be spread throughout the transaction data set (i.e., transmitted/received by a larger number of memory dies).

Still referring to FIG. 1, upon transition to x9 stripe width, memory access transactions are striped across one of two independently selectable sets of nine memory dies, so that each selected memory die $105_i$ transmits or receives a respective 8-byte fragment of the transaction data volume, with the data burst length doubling to 16 bit-intervals. A similar scaling occurs upon transition to the x6, x3, x2 and x1 stripe widths, with exemplary per-die data fragment sizes and burst lengths for the six different stripe width configurations as follows:

TABLE 1

| Stripe Width (#mem dies accessed) | Per-Die Fragment of 72 B Data Volume | Data Burst Length (in bit intervals) |
|---|---|---|
| 18 | 4 B | 8x |
| 9 | 8 B | 16x |
| 6 | 12 B | 24x |
| 3 | 24 B | 48x |
| 2 | 36 B | 72x |
| 1 | 72 B (entire volume) | 144x |

In the embodiment of FIG. 1, each memory die $105_i$ includes a page buffer or page register (depicted as "Page Buf") to temporarily store relatively large "pages" or "rows" of data retrieved from the core storage array of the IC. For example, in the case of a dynamic random access memory (DRAM) die, data pages on the order of 4 KB (four kilobytes, though smaller or larger page sizes may be implemented) or more are transferred from an address-specified row of storage cells to the page buffer (e.g., bank of sense amplifiers) in respective row activation operations, the row address constituting a component address within a controller-issued command/address value for a given memory access transaction. Thereafter, a column address—another component address within the command/address value—is applied to select one of multiple columns of data (addressable fractions of the buffered data page) to be output from the memory die in a memory read transaction or to be overwritten with write data in a memory write transaction.

Although successive memory access transactions may resolve to different columns within the same open page (i.e., activated data row resident in the page buffer), an entirely random access is likely to require activation of a newly selected data page. Presuming that to be the case in the memory access transaction depicted with respect to the x18 stripe-width configuration, each of the 18 memory components will carry out a respective row activation operation to enable access to a 72 byte transaction data volume. Assuming a 4 kilobyte (KB) row size, for example, an activation energy necessary to retrieve 18*4 KB=72 KB is expended in order to read or write a mere 72 bytes of data. By contrast, in the x1 stripe-width configuration, row activation occurs in only the single selected memory device, so that activation power consumption is reduced by a factor of 18 (i.e., a 94.4% activation power reduction) relative to the x18 stripe-width access (i.e., only a single 4 KB row is activated to enable a 72 byte read/write access). Thus, as FIG. 1 illustrates, activation power, and thus power consumed per memory transaction, is reduced as the stripe width configuration is narrowed from x18 to x9, to x6 and so forth down to a lowest-power x1 stripe-width configuration.

As table 1 illustrates, stripe-width reduction incurs a correspondingly longer data burst length and thus increases memory access latency (i.e., the increased serialization extends the time required to complete the transaction data transfer). Accordingly, in a number of embodiments, the memory control component (or another component in the host system) may select between available stripe-width options in accordance with application requirements and/or immediate circumstances (e.g., transition between predetermined or programmed trigger points corresponding to respective battery power levels). In one implementation, for example, memory control component 101 may configure memory module 103 at system startup, programming a stripe-width configuration deemed to best meet system or application requirements, and thereafter make on-the-fly transitions between available stripe widths as power and/or latency requirements change. Run-time changes to the stripe-width configuration may be limited to particular address ranges (e.g., to maintain integrity of data previously stored with a particular stripe-width) or even to subsets of memory devices. For example, in a memory module initially configured for x9 stripe width, the lower-order memory sub-rank (e.g., memory dies $105_0$-$105_8$) may be targeted as the primary data storage, leaving higher-order memory sub-rank (memory dies $105_9$-$105_{17}$) in reserve. Thereafter, in response to changing power/latency requirements or in the interest of access diversity, the higher-order x9 sub-rank may be re-configured into multiple reduced stripe-width sub-ranks (e.g., nine x1 stripe-width sub-ranks, three x3 stripe-width sub-ranks, one each of a x6 and x3 stripe-width sub-rank, four x2 stripe-width sub-ranks together with a single x1 stripe-width sub-rank, etc.). The memory control component may also choose to reorganize data stored with a given stripe-width for storage in an alternative stripe-width configuration, reading the data out with one stripe-width and re-storing the data with the alternative stripe-width until all or a desired portion of the data (or memory region) has been reorganized in the new stripe-width. Also, while the tradeoff between latency and power consumption is generally described herein in the context of DRAM core considerations (e.g., reducing row activation power), the same tradeoff and thus the same stripe-width configurability may apply in connection with other memory core technologies, including for example and without limitation, static random access memory (SRAM) cores, non-volatile memory cores (e.g., flash memory cores including NAND flash cores and NOR flash cores) and various other types of storage-class memory such as PCM (Phase-Change Memory), RRAM (Resistive Random Access Memory), CBRAM (Conductive Bridging Random Access Memory), etc. Accordingly, the particular memory core technologies described or referenced (explicitly or implicitly) in connection with various embodiments discussed above and below should be understood to be examples only—other memory core technologies may be alternatively or additionally employed in all cases and embodiments. Further, as discussed in connection with embodiments below, introduction of other critical timing paths (e.g., generation of a seed value for a security key) can mask the extra transport latency of the narrower stripe-width cases. This allows the low-power benefit to be realized without an apparent increase in transport time (because the increase in transport time is masked by the latency of a longer parallel activity).

Still referring to FIG. 1, some of the available stripe width options may yield a per-die data fragment that is not a divisor of the activated row size (page size), meaning that, after the maximum possible number of data fragments have been stored in a given storage row, the storage row (and therefore the page buffer) will have some residual capacity smaller than the per-die fragment size. Where the page size is constituted by a power-of-two number of bytes (i.e., $2n$ bytes, where 'n' is an integer), for example, stripe-width configurations that are not a power-of-two ratio to the maximum stripe-width configuration will generally yield unused, residual storage capacity. Also, generally speaking, as the stripe-width shrinks and per-die data fragment size grows, the residual storage capacity also grows, exacting an additional penalty or overhead (loss of useable storage capacity) for the improved power performance.

In a number of embodiments, the residual capacity created in sub-maximum stripe-width configurations is exploited for storage of metadata—that is, as discussed above, data generally transparent to a host requestor but nonetheless bearing a relation to the payload read/write data being supplied to or from the host.

FIG. 2 contrasts the memory page allocation in the x18 and x1 stripe width configurations of FIG. 1, illustrating the residual capacity incurred by the x1 stripe-width configuration of FIG. 1 and devotion/allocation of that otherwise unusable storage for metadata purposes. In the example shown, a 4 KB page size is assumed and thus storage for $2^{10}$ (1024) 4B data fragments per memory die in the x18 stripe width configuration. Referring specifically to shaded memory column 0003, a 64 byte payload data block ("64B DB"—host data) is striped across the page buffers of memory dies 0-15 in 4B fragments, while 8 bytes of EDC codes are striped across the page buffers of memory dies 16 and 17, also in 4 KB fragments, thus effecting storage of an entire 72 byte transaction data volume at a column address that resolves to one of 1024 locations within the page buffers of the 18 memory dies. By contrast, in the x1 stripe-width configuration, the non-power-of-two transaction data size (72B) incurs a 64 byte residual capacity in the power-of-two memory page (4 KB). That is, after storing 56 64B cache lines and 56 corresponding 8B EDC code sets (i.e., altogether, 56 column-accessible 72B transaction data sets or transaction data volumes), 64 bytes of residual capacity remains. As FIG. 2 shows, rather than simply forgoing the residual capacity as a cost of the lowered transaction power, the residual capacity is allocated for storage of metadata including, in a number of embodiments, individual metadata values that correspond to respective 64B payloads and, in some embodiments, that are error detection/correction protected by extensions of the EDC codes for the corresponding payload data.

FIG. 3 illustrates an exemplary data storage format in which residual capacity in a below-maximum stripe-width configuration (x1 stripe width in this case) is allocated to storage of security metadata. That is, 56 of the 64 bytes of residual capacity are allocated for storage of respective security seed values that correspond to the 56 payload data blocks (DB[55:0]). More specifically, in the example shown, the lowest-order eight bytes of the residual capacity are allocated to storage of eight 8b security seeds ('b' denoting "bit"); a respective security seed for each of payload data blocks DB[07:00]. Subsequent bytes of the residual capacity are similarly allocated to storage of security seeds for corresponding subsequent payload data blocks. The final eight bytes of the 64 byte residual capacity is allocated for storage of an eight byte seed value for the memory page (or storage row within the memory core) as a whole. Exemplary applications of the payload security seeds or "column security seeds" (as each payload data block and corresponding EDC value occupies a respective logical column) and "row security seed" are discussed below. Also, while allocation of the residual capacity to security seed storage is particularly compelling for a variety of applications, in alternative embodiments (or programmed configurations), the residual capacity or any portion thereof may be allocated instead to storage of other types of metadata including, for example, and without limitation, aging data, cache-tag information, identifier data (e.g., identifying a host process, processor core and/or other entity associated with the corresponding payload data block), and so forth.

Figure 4:
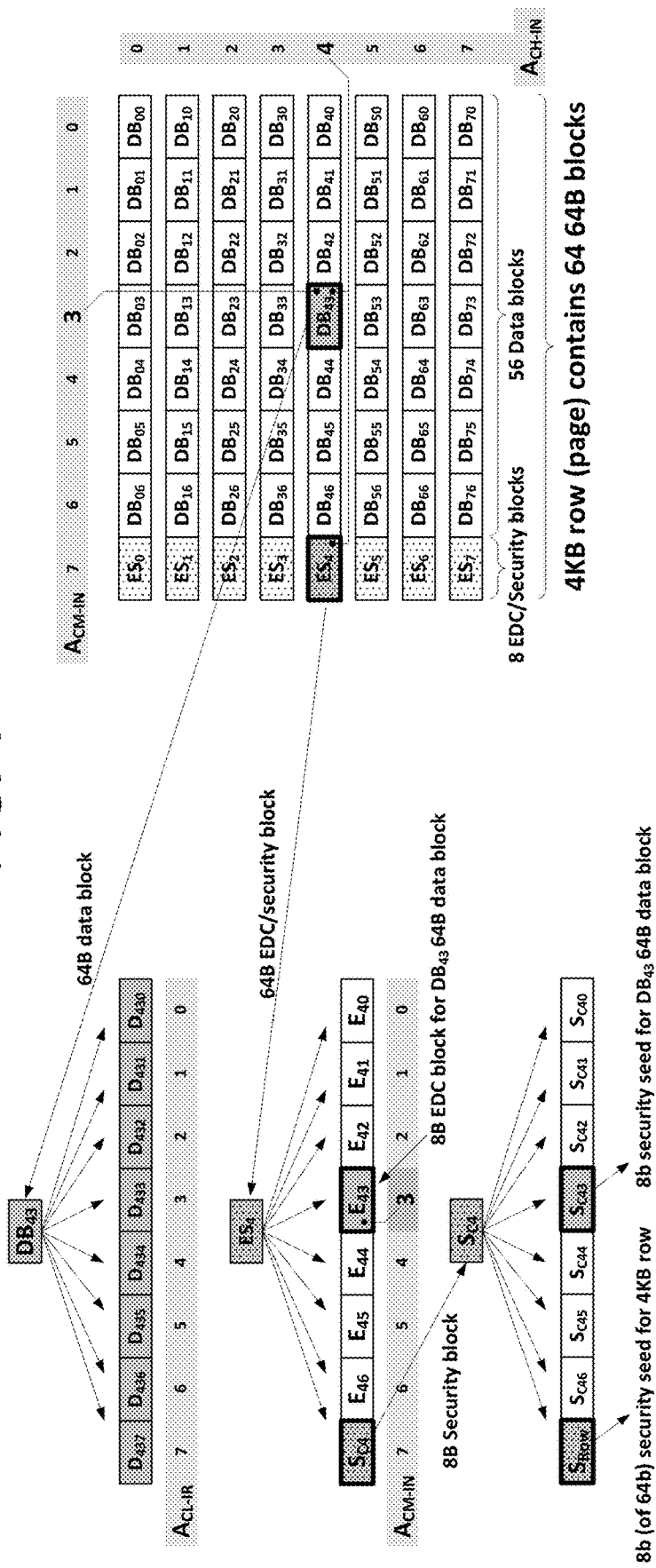
FIG. 4 illustrates an alternative mapping of 64 byte payload blocks, error detection/correction (EDC) codes and security seeds within a 4096 byte memory page.

FIG. 4 illustrates an alternative mapping of 64 byte payload blocks (host data blocks), EDC codes and security seeds within a 4096 byte (4 KB) memory page. In the particular example shown, the memory page is decomposed into eight logical sub-rows, each of which corresponds to a respective encoding of three high-order column-address bits, $A_{CH-IN}$ (i.e., incoming column-high address). Each of the logical sub-rows spans eight 64B data storage locations corresponding to respective encodings of mid-range column-address bits, $A_{CM-IN}$, and in which the lower seven of which are allocated to respective 64B payload data blocks, and the eighth of which is allocated to storage of a 64 byte combination of EDC codes and security seed information for the seven payload data blocks in the same sub-row. Thus, taking an example in which high and mid-range bits of an incoming column address form tuple value 43 (i.e., $A_{CH-IN}=4$, $A_{CM-IN}=3$), then payload data block $DB_{43}$ (in the fourth logical sub-row and third column of that sub-row) is selected for access with multiplexed $A_{CL}$ value (internally generated within the memory die as discussed below) controlling the order in which individual 8 byte components of the $DB_{43}$ payload block are output from the memory component or overwritten within the page buffer.

Still referring to FIG. 4, the EDC/Security information to be accessed in conjunction with the address-selected payload data block is likewise selected by the high-order and midrange bits of the incoming column address. That is, the high-order incoming column address bits ($A_{CH-IN}$) identify the 64B EDC/security block to be accessed, $ES_4$ (i.e., the 64B block at the end of the fourth sub-row in this $A_{CH-IN}=4$ example), and the midrange incoming column address bits ($A_{CM-IN}$) identify the specific 8 bytes of EDC codes within $ES_4$ to be read out of or overwritten within the page buffer ($E_{43}$). The 8 byte security value at the upper end of the 64B $ES_4$ EDC/Security block is accessed by an auto-generated low-order column address field to obtain the specific 8-bit column seed value ($S_{C43}$) for payload data block $DB_{43}$ (located at the byte offset indicated by $A_{CM-IN}$), while the 8-bit row seed value is accessed at a fixed offset at the high order ($7^{th}$) byte position of the $SC_4$ security block. As discussed below, where the time between successive data transfers over a given set of data links is constrained to an integer number of column access intervals, unused channel capacity may be absorbed by transmitting the entire 8B security block as part of the transaction data volume even though, during memory read transactions, only two bytes of security seed information may be put to use by the memory controller.

Reflecting on FIGS. 2-4, memory components having row sizes other than 4 KB (and/or that are used to store fragment sizes other than those shown) may yield residual capacities different than the 64B examples shown. In configurations that require a certain minimum residual capacity larger than that yielded for a given row size/fragment size, the desired capacity may be realized by linking together two or more banks, effectively multiplying the per-bank residual capacity by the number of linked banks. Although this merged-bank technique may reduce the number of effective banks, this reduction is counteracted by the effective bank increase that results from below-maximum stripe-width configurations.

One example of the bank merging (or bank-linking) approach occurs where the row size leaves insufficient residual capacity (after storing column security seed data) for a desired row security seed ($S_{ROW}$) size. For instance if a 64-bit row security seed is desired in a system populated by 2 KB/row memory components (i.e., 2 KB row leaves only 32 bits for row security storage after allocation of column security seed fields), joint operation of two banks enables the two 32-bit row security fields within those banks to be merged into a shared 64-bit row security seed storage that can be updated whenever any of the 72B transfer blocks in the two linked rows overflows its short 8-bit $S_{COL}$ value.

FIG. 5 illustrates an embodiment of a memory die 170 that may be used to implement each of the individual memory dies $105_0$-$105_{17}$ shown in FIG. 1 and that includes programmable and/or command-controllable address decode logic for accessing data, EDC and security information (or other metadata) in accordance with various stripe-width configurations. As shown, memory die 170 includes a bidirectional 4-bit data input/output (I/O) interface 171 ("DQ interface") and a 24-bit command/address ("CA") interface 173 for receiving commands and associated address values. Though not specifically shown, additional control and timing signals (e.g., data clock or strobe signals, command/address clock or strobe signals, clock-enable signals, reset signals, chip-select signals, on-die termination control signals, etc.) may be received within memory die 170 and applied in conjunction with the command/address signals to effectuate commanded memory access transactions.

In the particular example shown, memory die 170 includes sixteen independently accessible storage banks 175, each having $2^{14}$ 4 KB storage rows 177 (i.e., $2^{29}$ bits per bank and thus a one gigabyte (1 GB) total storage capacity, though significantly larger capacities may be achieved, particularly in high bit-density non-volatile memory dies, such as NAND Flash memory dies), together with a sense amplifier bank 179 that implements a corresponding 4 KB page buffer (512 instances of 8B storage). Each storage bank 175 additionally includes a row decoder 178 and column decoder 180 that enable selection of a storage row to be activated and data column to be accessed, respectively. Though not specifically shown in FIG. 5, each storage bank 175 additionally includes bank-enable logic that resolves encoded (or decoded) bank address signals ($A_B$) to enable selection of a particular storage bank (enabling row and column operations to be executed therein). Note that all storage unit and data access size examples herein may vary according to memory die capacity and/or organization. For example, each memory die may have a larger number of smaller-sized storage rows per bank (e.g., $2^{18}$ rows of 1024 4-bit columns, $2^{17}$ rows of 1024 8-bit columns, etc.), larger or smaller number of banks, and so forth Command/address interface 173 includes stripe-width controlled address/chip-select logic that decodes the incoming address values (generally received in separate row and column command/address transfers in DRAM implementations) and control signals to generate a stripe-width-dependent device-select signal (enabling the device to decode and respond to a commanded memory access transaction) and stripe-width dependent column access signals and data burst control signals. Inset 182, for example, illustrates address translation circuitry (i.e., within the command/address interface 173) that may be enabled in a x1 stripe-width configuration and that follows the page mapping shown in FIG. 4. As shown, the address translation circuitry includes multiplexers 183, 185 and 187 for steering (i) incoming bits of the high-order and low-order column address fields ($A_{CH-IN}$ and $A_{CM-IN}$) and (ii) fixed-address values and auto-incremented counter values to internally-routed column address lines, $A_{CH-IR}$, $A_{CM-IR}$ and $A_{CL-IR}$ (shown collectively as Ac at the input of column decoder 180). More specifically, an 80 byte memory read/write access effected in ten successive 8 byte transfers between page buffer 179 and DQ interface 171 (i.e., prefetch=8 bytes) is implemented by a sequence of 10 column decode operations to retrieve or overwrite, in order, an 8 byte (64b) security seed value 'z', eight 8-byte payload data values 'x' (totaling to a 64B payload data block) and then 8 bytes of EDC codes 'y'. Taking these decode operations in order and assuming a memory read transaction, the security seed z is retrieved from (i) the sub-row indicated by $A_{CH-IN}$ (see multiplexer input 'z' within $A_{CH}$ multiplexer 183 which receives a three-bit $A_{CH-IN}$ field), (ii) the high order one of the eight 64B blocks within the $A_{CH-IN}$-specified sub-row (see multiplexer input 'z' within $A_{CM}$ multiplexer 185, which receives a fixed three-bit '7' value (i.e., '111' binary) and thus selects the EDC/security block at the high-end of the $A_{CH-IN}$-selected sub-row), and (iii) the high-order one of the eight 8B blocks within the selected EDC/security block (see multiplexer input 'z' within ACL multiplexer 187, which also receives a three-bit '7' value and thus selects the 8 byte security block at the high end of the selected 64B block).

Still referring to FIG. 5, retrieval of constituent 8 byte components of the 64 byte payload data block occurs via paths 'x' in the $A_{CH}$, $A_{CM}$ and $A_{CL}$ multiplexers (183, 185, 187), with the latter being controlled by a 0-7 counter to effect a linear output ordering of the 8B constituents of the 64B payload data block (various different or programmable output orders may be implemented in alternative embodiments). Similarly, the eight bytes (64b) of EDC are selected via paths 'y' in the $A_{CH}$, $A_{CM}$ and $A_{CL}$ multiplexers. As can be seen from the mapping in FIG. 4, this EDC access is effected by supplying the $A_{CH-IN}$ bits to $A_{CH-IR}$ via the $A_{CH}$ multiplexer 183, passing fixed address value '111b' (i.e., '7') through $A_{CM}$ multiplexer 185 to choose the high order 64B block of the $A_{CH-IN}$ selected sub-row, and then routing the $A_{CM}$-IN bits to the $A_{CL-IR}$ lines via ACL multiplexer 187 to select the desired eight byte component of the 64B EDC/security block (i.e., the eight byte component that corresponds to the offset of the payload data block within the $A_{CM-IN}$-specified sub-row).

Still referring to FIG. 5, to access a 64 byte security seed information at the end of a given sub-row (e.g., for purposes of retrieving or overwriting all 8b components of the 64b row seed), the $A_{CH}$, $A_{CM}$ and $A_{CL}$ multiplexers are set by operation control logic 189 to select the 'v' path for each of eight 8B prefetch (or overwrite) operations. In that case, $A_{CH-IN}$ multiplexer 183 delivers an incremental sequence of values, 0-7, to the $A_{CH-IR}$ lines (thereby selecting each of the eight sub-rows of the activated row one after another), while fixed '111b' (7) address values are routed onto the $A_{CM-IR}$ and $A_{CL-IR}$ lines via $A_{CM}$ multiplexer 185 and $A_{CL}$ multiplexer 187, respectively.

In one embodiment, a memory control component specifies a request to read or write the 64B security seed information (a "security-dedicated" read/write access) by providing a command or operation code specifically dedicated to that purpose (i.e., a command code other than that used to effect a payload data read or write operation). In the embodiment of FIG. 5, for example, operation control logic 189 within the CA interface responds to an incoming security-dedicated command code by setting column address multiplexers 183, 185 and 187 to pass the auto-generated address tuple 0-7:7:7 (where '0-7' indicates a counter incremented sequence from 0 to 7) onto the internally-routed column address lines, $A_{CH-IP}$:$A_{CM-IR}$:$A_{CL-IR}$. In alternative embodiments, seed read/write access may be omitted.

FIG. 6 illustrates exemplary command/address signaling and read-data transfer for two x1 stripe-width memory access transactions directed to respective instances of the memory die shown in FIG. 5 (i.e., one instance being memory die 0 ("Mem-0") of a memory module such as that shown in FIG. 1, and the other instance being memory die 1 ("Mem-1")). The commands directed to memory die 0 and corresponding read data transmission are shown without shading, while the commands and data transmission for the memory die 1 transaction are shaded.

Referring to the memory die 0 commands and data transfer, an activation command ('A') and corresponding address information (e.g., bank address, row address and possibly one or more chip identification signals) are supplied to initiate a row activation operation in which an address-specified row of data is transferred to the die-0 page buffer. After a $t_{RCD}$ interval (RAS-to-CAS delay) transpires, a column access command specifying a read or write access—in this example a read access 'R'—is supplied together with column address bits $A_{CH-IN}$ and $A_{CM-IN}$ to initiate a 72B burst output from the x1 configured die. As shown, output data appears on the DQ pins (one 4-bit nybble at time) a TCAC interval later, so that the 72 byte stream, ordered as shown in FIG. 6 (i.e., 8B of security seed information ('S') at leading edge of burst, eight 8B payload data values (Q0/Q1, Q2/Q3, . . . , Qe/Qf) and thus a 64B payload data block thereafter, followed by eight bytes of EDC codes (E)). In the particular embodiment shown, a synchronous double-data-rate (DDR) transmission is assumed (i.e., two bits transmitted per cycle of strobe or clock timing signal, so that the bit-time interval is a half-cycle of the timing signal), with each 8-byte component of the 80 byte transaction data volume being output during a respective 5 nanosecond $T_{CC}$ interval (minimum time between column access operations within a given memory die) as a respective burst of 16 4-bit values—160 4-bit transmissions in all for a per-die data rate of 12.8 Gbs (gigabit per second), per-link data rate of 3.2 Gbs and bit time of 0.3125 ns. The 24-bit command/address path is operated at a single-data rate (e.g., only transmitting CA information on the rising (or the falling) edge of timing signal) using a half-rate command clock or strobe timing signal to achieve a 19.2 Gbs CA path bandwidth, or 0.8 Gb/s per CA link. As shown, a x1 stripe-width transaction is initiated with respect to the Mem-1 die a half $t_{CC}$ interval (2.5 ns) after initiating the die 0 transaction, so that both dies are concurrently outputting or receiving transaction data volumes. This concurrency may be extended to all the dies of a selected memory rank (or even dies on diverse memory ranks so long as the selected dies are coupled to distinct data signaling paths) to achieve the same data throughput as in other stripe-width configurations, despite the higher transaction latency in narrower stripe-width configurations. Note that different data path and command/address path widths (i.e., numbers of constituent signaling links) may be provided in alternative embodiments, and the particular data rates and signal transmission parameters, including clock rates, bit times, prefetch sizes, timing metrics (e.g., $T_{CC}$, $T_{RCD}$, $T_{CAC}$, etc.), may be different from those shown. Also, while the transmission of the security seed at the leading edge of the data transfer enables concurrency between decryption pad generation and payload data block reception—discussed in greater detail below—transaction data volumes may be reordered in different sequences in alternative embodiments or programmable configurations.

Figure 7:
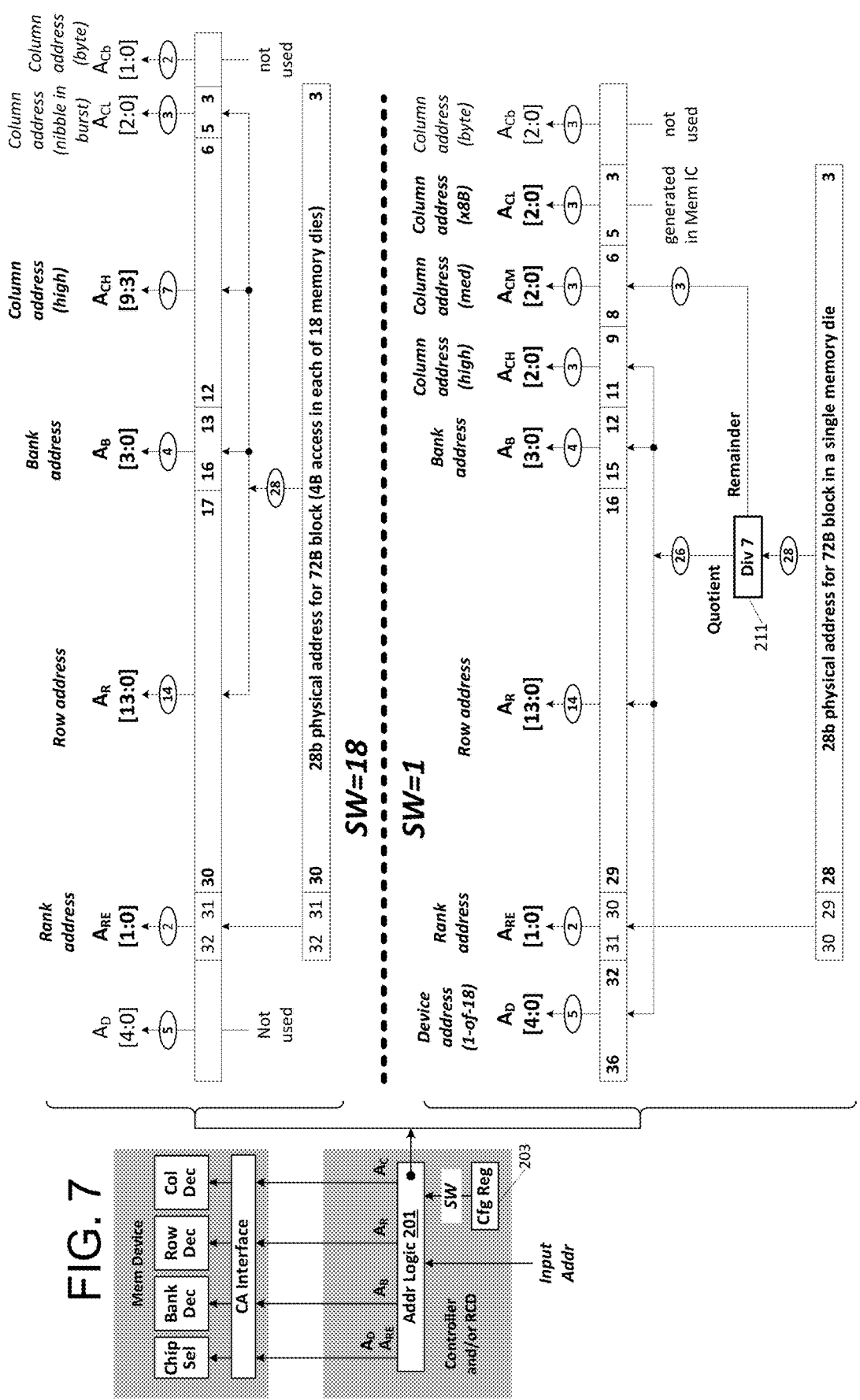
FIG. 7 illustrates an embodiment of an address logic circuit that may be implemented within a register-configured memory control component or on-module buffer device to convert an incoming address into stripe-width specific memory address fields.

FIG. 7 illustrates an embodiment of an address logic circuit 201 that may be implemented within a register-configured (203) memory control component or an on-module buffer device (i.e., register/clock driver or "RCD") to convert a 28-bit incoming address into stripe-width specific memory address fields supplied to memory-die command/address interface logic (e.g., as discussed in reference to FIG. 5). The CA interface logic, in turn, routes the incoming address fields, including device ($A_D$), rank ($A_{RE}$), bank ($A_B$), row ($A_R$) and column ($A_C$) address fields to chip-select and address-decoding circuits, including bank, row and column address decoders.

Contrasting the x18 and x1 stripe-width address conversions, address bits $A_D[4:0]$ are used to select one of 18 devices within an $A_{RE}$-selected rank in the x1 configuration, but unused in the x18 configuration (as all devices in the rank are selected). Conversely, a higher bit-depth column address is supplied in the x18 configuration to enable resolution of the column access to a 4B region of the page buffer, while only six column address bits ($A_{CH}$ and $A_{CM}$) are delivered to the memory die in the x1 stripe-width in view of the coarser column data access (i.e., one of 56 payload data blocks and corresponding EDC codes and metadata). Further, in accordance with the mapping arrangement shown in FIG. 4 and multiplexing logic shown in FIG. 5, a divide-by-7 circuit 211 ("Div 7") is engaged to yield a memory-die-destined address that skips over every eighth 64B block within an activated memory page, thus enabling that 64B block to be reserved for EDC and security information as discussed above. More specifically, the lower three bits of the divide-by-7 quotient are output as the high-order column address bits ($A_{CH}$ and, more specifically, $A_{CH-IN}$ from the perspective of the memory die) while the three-bit remainder of the divide-by-7 operation (i.e., incoming address modulo 7 and thus a value that ranges from 0 to 6) is output as the mid-range column address bits ($A_{CM}$ or, from the memory die perspective, $A_{CM-IN}$). By this arrangement, a linear advance through a continuous range of column addresses will yield $A_{CH}$ and $A_{CM}$ address fields that skip over the 64B EDC/security blocks, leaving those blocks to be retrieved by stripe-width-dependent auto-addressing logic within the selected memory dies, as shown for example in FIG. 5.

In a number of embodiments, divide-by-7 circuit 211 is implemented in the memory control component shown in FIG. 1 or within an on-module buffer component (e.g., within a register clock driver component (RCD) as discussed below). The quotient and remainder values may be generated in a single clock cycle within the implementing component (e.g., executing several carry-save additions within full-adder gates together with a single 32-bit carry-propagate addition) and thus will yield a latency increase in the overall memory access path—a small additional latency (e.g., ~1 ns) compared to the other latency differences discussed above.

Figure 8:
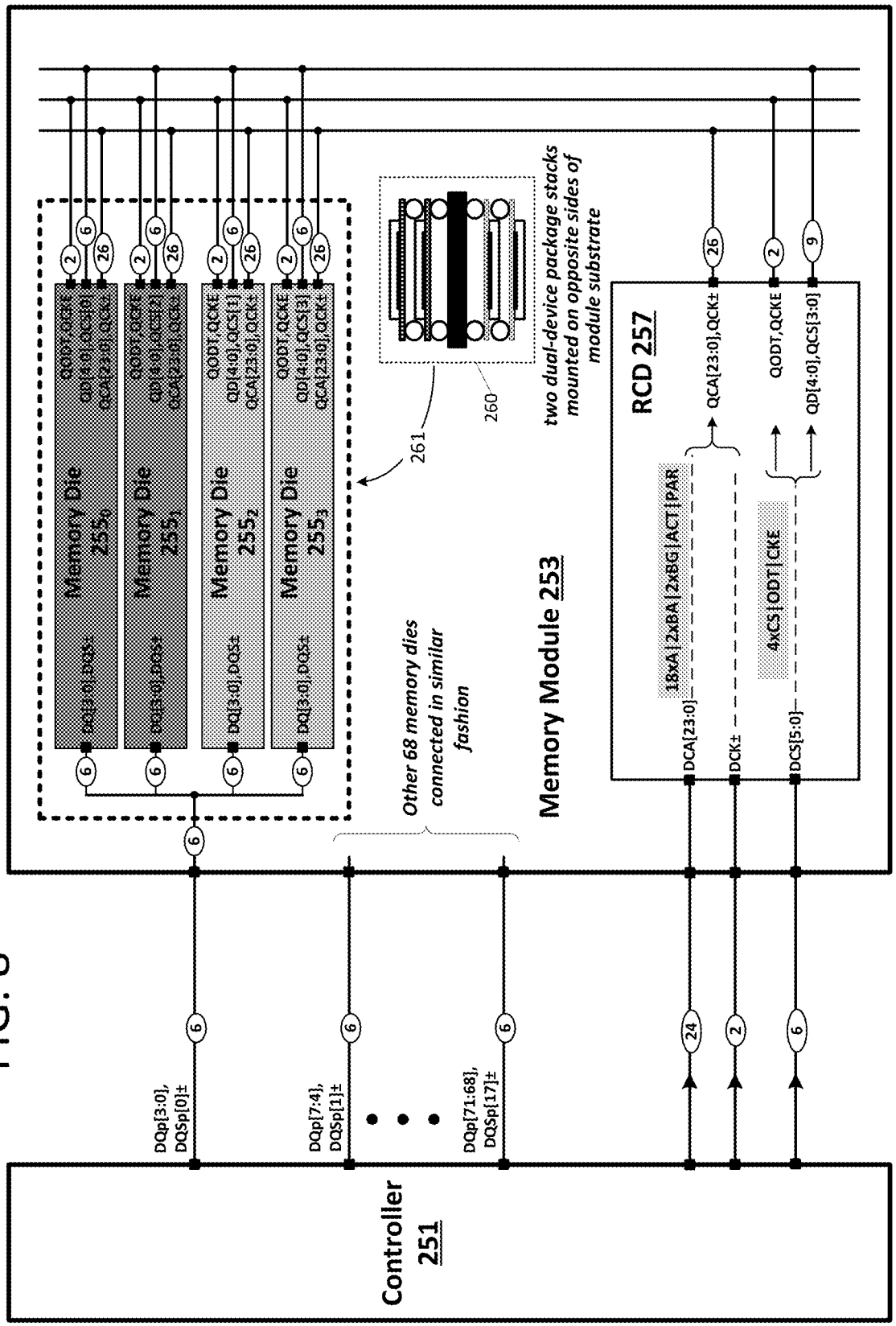
FIG. 8 illustrates an embodiment of a memory system having a control component and registered (or buffered) memory module that implement the above-described stripe-width configurability and stripe-width-dependent information transfers.

FIG. 8 illustrates an embodiment of a memory system having a control component 251 and registered (or buffered) memory module 253 that implement the above-described stripe-width configurability and stripe-width-dependent information transfers (e.g., security seed or other metadata embedded in transaction data volume). In the depicted example, memory module 253 is implemented as a DIMM having 18 memory inline memory sites on either side of a module substrate (36 sites in all), with each die site populated by a two-die stacked memory package (e.g., DRAM, SRAM, non-volatile memory etc. as discussed above). In one embodiment, shown for example at 260, each of the four dies within a pair of opposing stacked memory packages (i.e., the two packages disposed opposite one another on the module substrate) is allocated to a respective one of four memory ranks, with each memory rank thus being constituted by 18 dies disposed in respective one of the two sets of memory packages.

An exemplary set of the four memory dies $255_0$-$255_3$ within opposing stacked memory packages is shown in detail view 261, with different shading to distinguish the die pairs from the frontside and backside memory packages. As shown, each of the four dies includes a 4-bit data signaling interface (DQ[3:0]) and accompanying differential strobe (two line) interface (DQS±, where '±' denotes a differential, two-line signal)—six lines in all—to enable strobe-synchronous (and/or clock synchronous, depending on implementation and/or data flow direction) burst transmission and reception of 4-bit information-bearing symbols (including payload data symbols, EDC codes, and security or other metadata symbols). Each memory die also includes a command/control interface to receive on-die termination control (QODT), clock-enable (QCKE), device address (QD[4:0], chip-select (QS[i]), command/address (QCA[23:0]) and clock signals (QCK±). Note that while the command/control interface of each memory die is shown as being coupled to the same command/address or control signal line for all signals except for chip-select, this depiction is meant only to indicate that the same logical signal is received within all the memory dies. Where signal fan-out constraints limit the practical number of destinations for a given signal, signals may be replicated on signal lines dedicated to respective groups of memory dies. Also, one or more separate instances of some control signals (e.g., QCKE, QODT) may be output by the memory control component itself and routed to respective groups of memory dies. Further, while not specifically shown, each memory die may additionally include a serial or other relatively low-pin-count interface (e.g., coupled in a daisy-chained fashion through all the dies of a given memory rank) to enable individual dies to be accessed and programmed with respective device addresses (or chip identifiers). Per device configuration can also be accomplished through a combination of slice selection via the data links and rank selection via the chip select links. For example, mode registers within respective memory dies may be programmed with different device or chip identifiers in response to individual die-selection (addressing) signals on the DQ pins and one or more mode register programming commands/identifier values provided via the command/address path.

In the particular example shown in FIG. 8, each of the four memory dies receives a respective one of four chip-select signals QCS[0]-QCS[3] and a common set of five device-address signals, also referred to herein as stripe-identifier signals. By this arrangement, a maximal x18 stripe-width setting may be effected by programming the dies to share the same stripe identifier and thereafter applying an incoming rank address (after decoding) to the chip-select lines to select one rank of 18 devices to decode and respond to an incoming memory access command. Similarly, division of each or any of the memory ranks into multiple sub-ranks (or stripes) may be effected by differentiating the device addresses programmed within individual memory dies. More specifically, in the 18-die-per-rank example shown, two different device addresses may be programmed within respective groups of nine memory dies to effect a x9 stripe-width configuration; three different device addresses may be programmed within respective groups of six memory dies to effect a x6 stripe width; six different device addresses may be programmed to effect a x3 stripe width; nine different device addresses may be programmed to effect a x2 stripe width and 18 different device addresses may be programmed to effect a x18 stripe width. As discussed above, the stripe-width configurations may be varied from rank to rank, and other combinations of stripe widths (e.g., sub-ranks having disparate numbers of constituent memory devices and thus non-uniform stripe-widths across the memory rank) may be effected by programming device addresses in non-uniform quantities within a given memory rank.

In the buffered memory module of FIG. 8, RCD component 257 (i.e., buffer component) receives command/address, clock and control signals from memory control component 251 and routes those control signals to the memory dies via the internal signaling paths shown. In one embodiment, RCD component 257 receives four fully-decoded chip-select signals that are routed to respective ranks of memory dies, as well as ODT and clock-enable signals that are routed in common to all memory dies. The RCD component may also translate incoming address signals in accordance with a programmed stripe-width configuration as generally discussed in reference to FIG. 7. For example, RCD component 257 may perform a divide-by-7 operation (i.e., if that logic operation is not implemented by memory control component 251 as it may in an alternative embodiment or configuration) and may similarly drive one or more sub-fields of the incoming command/address signals to the device-address inputs (QD[4:0]) of the memory dies to effect sub-rank selection. More generally, RCD component 257 performs signal replication as necessary to meet practical driver-loading/fan-out constraints and to support stripe-width configuration as discussed above. The specific numbers of signals received and/or output by the RCD component may thus be different from that shown (e.g., RCD component 257 may receive multiple instances of the on-die termination and/or clock-enable signal, additional chip-select signals to support fully-encoded or partially-encoded chip-select schemes, etc.).

Figure 9:
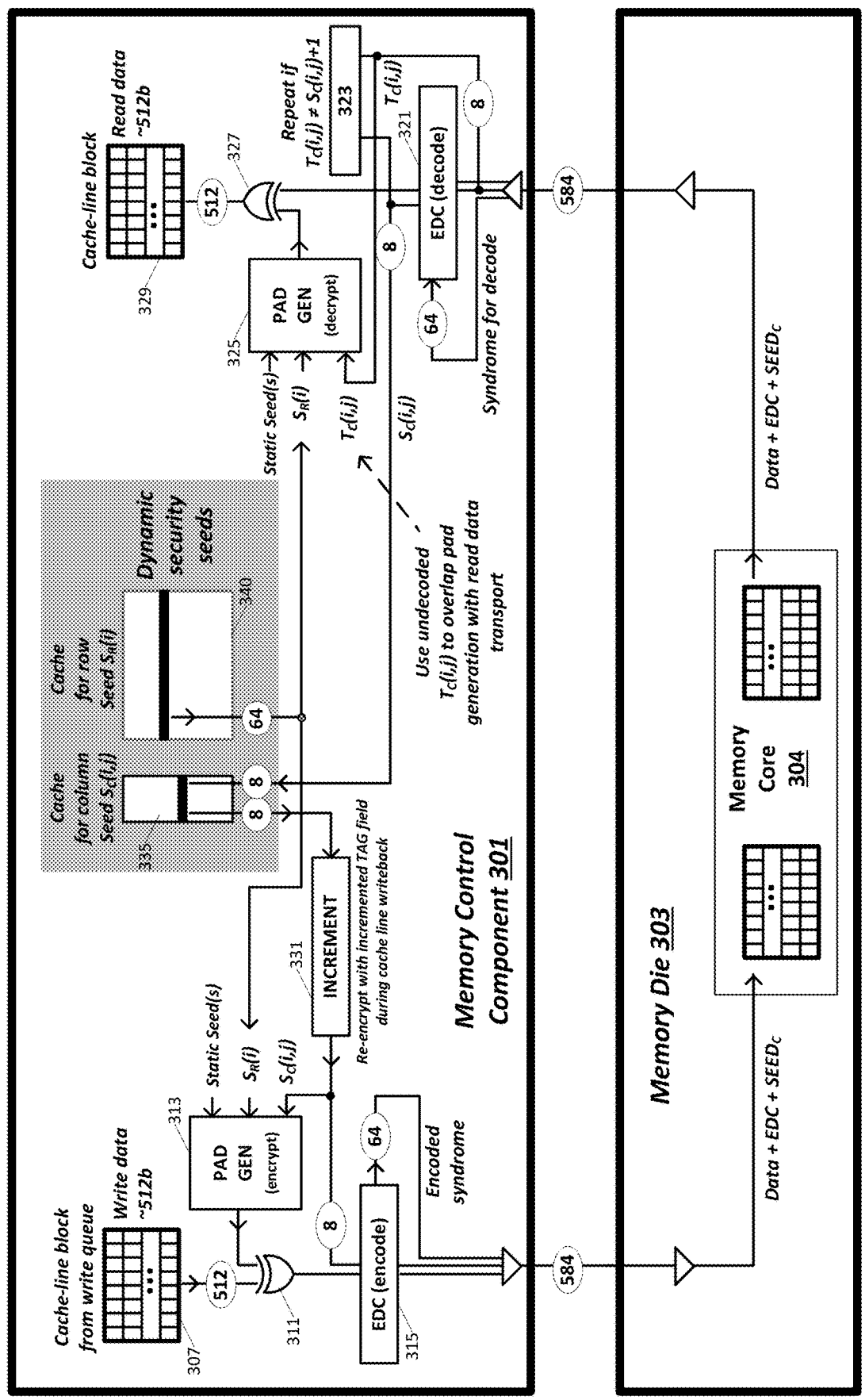
FIG. 9 illustrates an exemplary application of column and row seed information that may be implemented within any of the stripe-width configurable memory system embodiments in reference to FIGS. 1-8.

FIG. 9 illustrates an exemplary application of column and row seed information that may be implemented within any of the stripe-width configurable memory system embodiments discussed above. Starting with the data-write path within memory control component 301, a cache-line block (or payload data block) from a write queue 307 is XOR'd (i.e., sum without carry) with an encryption pad value from pad generator 313 in XOR gate 311 to generate encrypted payload data. The encryption pad value itself is seeded by a row seed and column seed that corresponds to the row (i) and column (i, j) of the memory location to be accessed within memory die 303 (i.e., in accordance with the row and column address specified in the memory write request), as well as one or more relatively static seed values (e.g., virtual or physical cache-line address, initial seed value set at system initialization, process identifier or any other value unique to the process or thread that initiated the memory write request, etc.). As shown, the encrypted payload value (output of XOR gate 311) and column security seed are supplied to an EDC code generator 315 which generates an 8 byte EDC code block that enables detection and correction of single-symbol errors within the encrypted payload data and column security seed (and at least detecting occurrence of instances of multiple symbol errors). As shown, the column security seed, encrypted payload data and EDC code block are transmitted to the memory die in a 584-bit data transmission (the actual transmission size may be padded to 640 bits (80 bytes) as discussed above and/or may include row security seed information as discussed below).

Still referring to FIG. 9, memory die 303 stores the encrypted payload data and associated column security seed and EDC code block within memory core 304 as shown (and as generally discussed above) later returning the same information to memory control component 301 in a memory read transaction. In the particular embodiment shown, the column security seed is received within memory control component 301 before the payload data or EDC block (i.e., by virtue of transmission at the leading edge of the data burst as shown in FIG. 6) and thus may be compared with the column seed cached by the memory control component (i.e., with column see cache 335). In the depicted example, the cached column seed is incremented by increment logic 331 upon each application to an outgoing payload so that seed comparator 323 compares the incoming column security seed ($T_c(i,j)$) with an incremented version of the cached column seed ($S_C(i,j)$). If a column-seed mismatch is detected, then the column seed is deemed to have one or more symbol errors that may subsequently be corrected by EDC decoder 321. In that case, the column-seed comparison is re-executed by seed comparator 323 following completion of the EDC decode operation with respect to the incoming column seed. If the column seeds still do not match and if the EDC code indicates that the incoming column seed is error free, then a security violation may be signaled to the host requestor and/or other appropriate security measure carried out. If a valid column security seed is received (i.e., match signaled by comparator 323), the incoming column seed is applied, together with any static seeds and the row security seed to generate a decryption pad within decryption pad generator 325. The decryption pad is applied, in turn, to decrypt the error-corrected payload data and thereby generate a read data block (or cache-line block) to be returned to the read data requestor and/or cache memory (and which may optionally be buffered in read data buffer 329). As shown, the incoming column security seed is also written back to the column seed cache, thus overwriting the previously cached column seed with an incremented column seed value.

As FIG. 9 illustrates, receiving the column security seed at the leading edge of the read data transfer and comparing the received and cached seeds without waiting for error detection/correction enables decryption pad generation concurrently with read data propagation from memory die 303 to control component 301 (i.e., during the read data flight time), thus avoiding latency that would otherwise be incurred awaiting decryption pad generation.

In one embodiment, the row security seed is updated within row seed cache 340 whenever one of the column seeds overflows (i.e., rolls over from a maximum value to zero or other minimum value). In that case all data in the subject row within memory die 303 is read and re encrypted with the new row seed and column seed and then written back (e.g., a read/re-encryption/write-back sequence is executed for each of the 56 72B blocks in the x1 stripe-width example shown in FIGS. 3 and 4). At the end of the update operation, the row security seed values may be rewritten within the subject row of memory die 303 using the exemplary 64-bit row seed access shown in FIG. 5 (i.e., in response to a special command that allows access to the metadata containing the row security seed).

Figure 10:
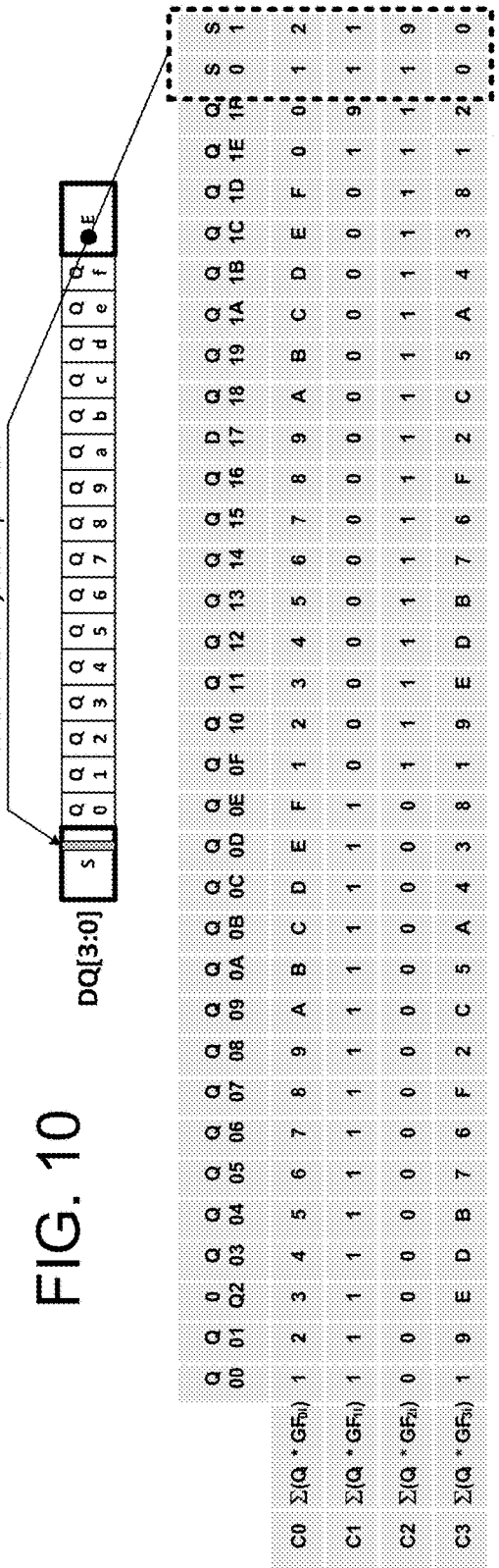
FIGS. 10-12 illustrate exemplary EDC code extensions that may be applied to enable detection and correction of errors within metadata (e.g., security seeds) prepended, appended or otherwise embedded in a transaction data volume.
Figure 11:
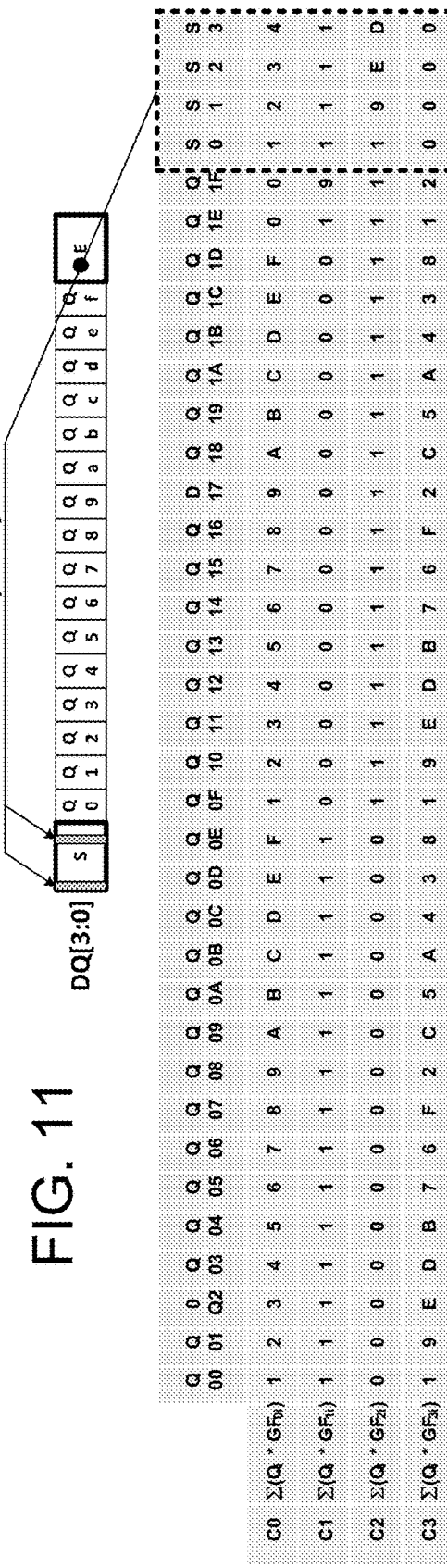
Figure 12:
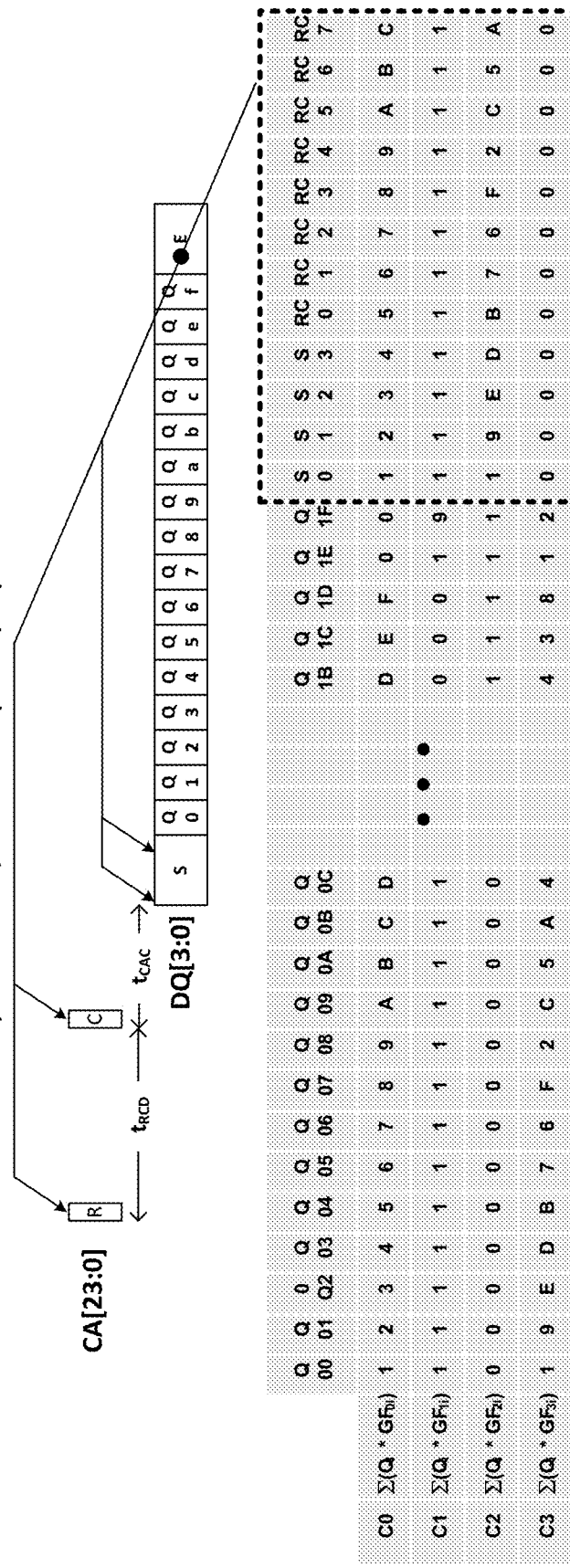

FIGS. 10-12 illustrate exemplary EDC code extensions that may be applied to enable detection and correction of errors within metadata (e.g., security seeds) prepended, appended or otherwise embedded in a transaction data volume. In one embodiment, unused error detection codes available within the four checksum symbols derived from a 16-symbol parity code (e.g., applying a finite field, such as a sixteen-symbol Galois Field ("GF")) are applied to protect an additional byte of metadata (two additional 4-bit symbols) per transaction data volume and thus enable error detection/correction with respect to the 8b column security seed in the security-seed implementations discussed above. FIG. 10 illustrates the EDC code extension in this case, showing two additional codes S0 and S1 that enable error detection/correction with respect to the 8-bit column security seed. FIG. 11 illustrates a further EDC code extension, showing four additional codes, S0-S3, that enable error detection/correction with respect to both the 8-bit column security seed and the 8-bit row security seed (or any other two bytes of meta data transmission). FIG. 12 illustrates yet a further EDC code extension showing, in addition to the four additional EDC codes S0-S3, another eight EDC codes that may be used to detect and correct errors within an incoming 32 bit address field. This EDC-protected addressing enables a memory die to detect and possibly correct address bit errors that may otherwise result in a misdirected memory access. More generally, the extended EDC codes (e.g., extending up to a total of 60 codes in the GF(16) example shown) may be used to protect any metadata and/or command/control/address information associated with payload data.

Figure 13:
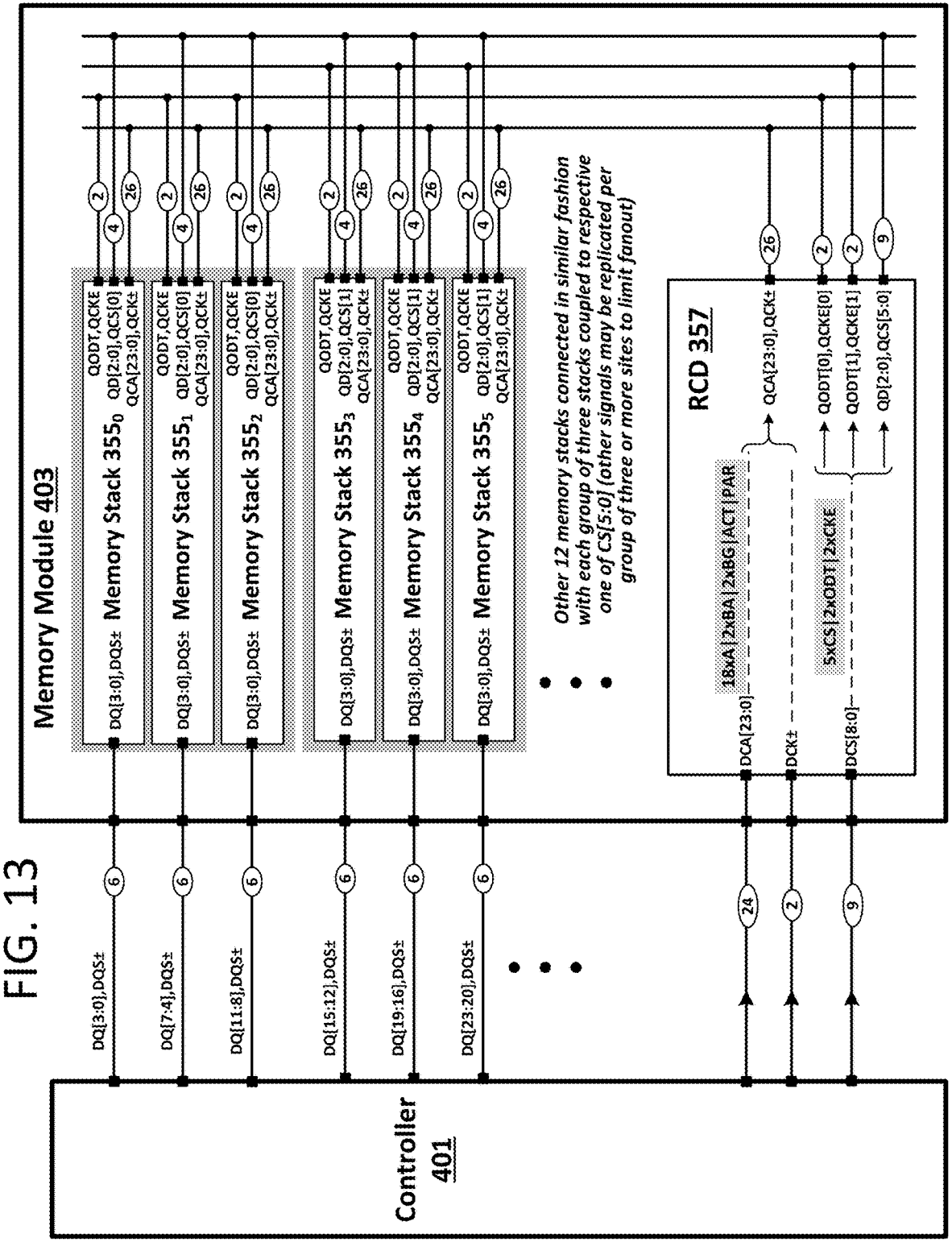
FIG. 13 illustrates an alternative stripe-width configurable memory system having a minimum three-die stripe width (x3) to enable implementation with commercially available stacked-die DRAM components.

FIG. 13 illustrates an alternative stripe-width configurable memory system having a minimum three-die stripe width (x3) to enable implementation with commercially available stacked-die DRAM components. In the particular embodiment shown, memory module 403 includes 18 DRAM stacks 335$_{17}$ (only the first six of which are shown) each implemented by a commodity memory package containing a stack of eight memory dies. The data interface, command/address interface, and control signal inputs of each die in a given DRAM stack are coupled in common to the external contacts of the memory package so that all dies in a given stack receive the same command/address and control signals and share the output bus. Also, each of the memory dies within a given DRAM stack includes, as part of its control signal inputs, a chip-select input and a device address input (QD[2:0]) that are, in conventional schemes, applied to permit selection of one of 16 ranks in a DIMM populated by two inline rows of such stacked memory packages. That is, a first chip select signal may be coupled to all the memory packages on one side of a module substrate, and another chip-select signal to all the memory packages on the opposite side of the substrate, while the device address field may be coupled in common to all the memory packages to enable selection, as a memory rank, one of eight dies within each memory package on a chip-select-specified side of the memory module.

In the exemplary memory module 403 of FIG. 13, multiplexing circuitry within an RCD component 357 enables the chip-select signals issued to respective groups of memory packages to be differentiated and thus effect variable stripe-width configuration. More specifically, in the particular implementation shown, RCD 357 receives an incoming set of five chip-select signals ("5×CS") and applies those signals together with an additional chip-identifier bit supplied via command/address path DCA[23:0] to resolve a memory access to a minimum stripe-width of three memory dies. More specifically, in a x3 stripe-width configuration, the RCD decodes the incoming six-bit stripe-select field (i.e., 5×CS+chip identifier bit) to select, as respondents to an incoming command/address, one of eight memory ranks (each rank consisting of 18 dies) and one of six sub-ranks (each sub-rank consisting of three dies) within the selected rank. In the particular implementation shown, RCD 357 resolves the x3 sub-rank selection by outputting a respective one of decoded chip-select signals QCS[5:0] to each of the six groups of three die stacks and a three-bit device-address value QD[2:0] to all the die stacks, thereby enabling selection of a given x3 set of the die stacks and a given memory die within each of the three selected die stacks. Other control and command/address signals, including on-die-termination (ODT) control and clock-enable (CKE) signals, command/address signals QCA[23:0], and differential command clock signals CK± are routed in common to the die stacks, although any or all of those signals may be replicated at the memory control component or within the RCD component to meet fan-out constraints and/or accommodate legacy wiring patterns. In the particular example shown, for instance, two ODT signals and two CKE signals are provided by the control component and routed alternately to even and odd x3 sub-ranks.

Still referring to FIG. 13, when configured for x6 stripe width, x9 stripe width or x18 stripe width, RCD component 357 asserts the six QCS[5:0] signals in pairs (i.e., one of three pairs of QCS signals asserted to enable selection of a corresponding one of three x6 sub-ranks), groups of three (enabling selection of either of two x9 sub-ranks) or simultaneously (selecting an entire x18 memory rank), respectively. As in embodiments discussed above, non-uniform division of a given memory rank may be achieved by driving different numbers of chip-select signals in successive accesses (e.g., asserting one of three independently managed chip-select signals to select one of three x3 sub-ranks allocated within a memory rank (SW=3), and simultaneously asserting the remaining three chip-select signals to select, as a x9 sub-rank, the remaining dies of the memory rank (SW=9).

Figure 14:
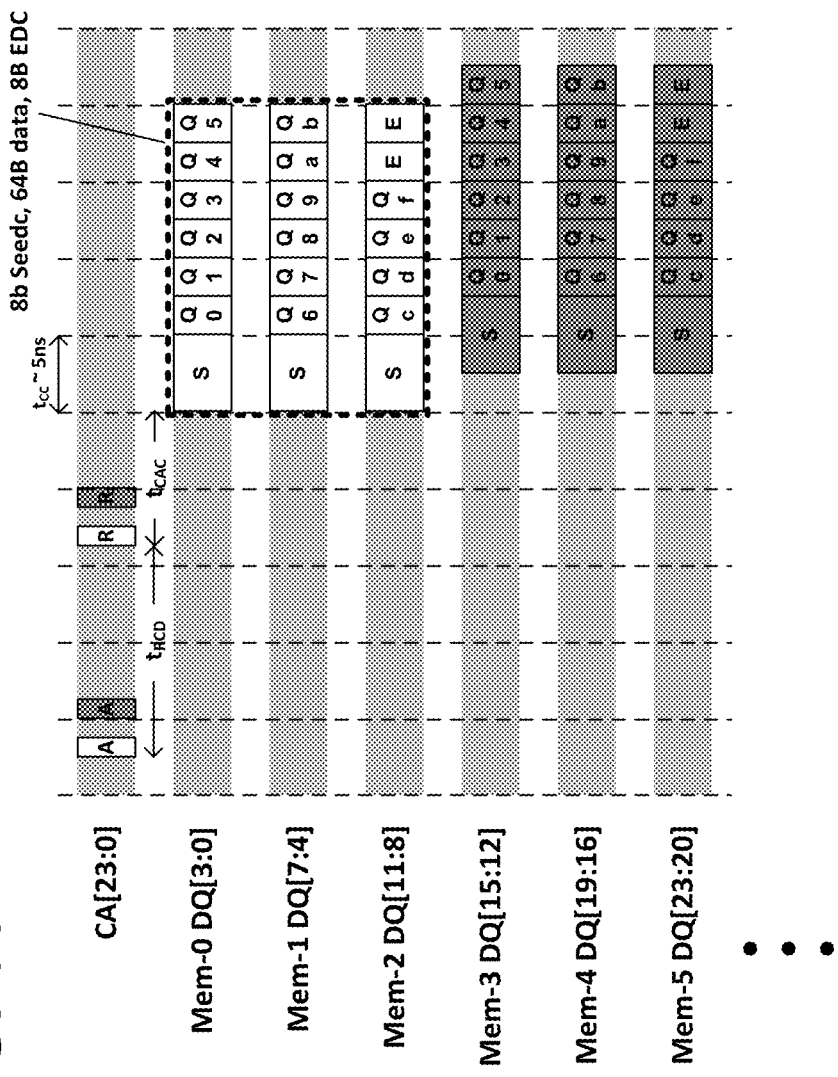
FIG. 14 illustrates an exemplary pair of transaction data volumes within a x3 stripe-width configuration of the memory system depicted in FIG. 13.

FIG. 14 illustrates an exemplary pair of transaction data volumes within a x3 stripe-width configuration of the memory system depicted in FIG. 13. As in the transaction timing diagram of FIG. 6, two sets of activation and column-access commands, directed to respective x3 sub-ranks of memory devices, are received within the memory module to initiate respective x3 memory access transactions (the two transactions being shown respectively with and without shading). In the particular example shown, security information or other metadata is transferred as the leading eight bytes output by (or received within) each memory die of the x3 sub-rank, and eight bytes of EDC codes are transmitted by only one of the three memory dies, at the trailing edge of the data transfer. Accordingly, a disparate address mapping of payload data blocks, security data and EDC codes is applied within each of the constituent memory dies of the three-die rank (i.e., more payload data stored in Mem-0 and Mem-1 than in Mem-2, and EDC codes stored in Mem-2 only. Column addressing logic to achieve this non-uniform mapping may be implemented generally as described with respect to FIG. 7, with auto-address generation being modified as necessary to meet the mapping within individual memory dies.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied in combination with any other of the embodiments or in place of counterpart features or aspects thereof. Accordingly, the specification and drawings are to be regarded in an illustrative rather than a restrictive sense.

What is claimed is:

1. A method of operation within an integrated-circuit memory component, the method comprising:
   receiving a configuration value;
   receiving command/address value;
   if the configuration value specifies a first addressing resolution, decoding N bits of the command/address value to access contents within a first one of $2^N$ independently accessible regions of a page buffer; and
   if the configuration value specifies a second addressing resolution:
   decoding a first composite address that includes fewer than N bits of the command/address value together with a plurality of bits generated by a counter circuit within the memory component to access contents within a second one of the $2^N$ independently accessible regions of the page buffer, and
   decoding a second composite address that includes the fewer than N bits of the command/address value together with a plurality of bits having a fixed and predetermined state to access contents within a third one of the $2^N$ independently accessible regions of the page buffer.

2. The method of claim 1 wherein decoding N bits of the command/address value to access contents within the first one of the $2^N$ independently accessible regions of the page buffer comprises decoding N column-address bits conveyed in the command/address value to (i) read-out contents within one of $2^N$ independently accessible column locations within the page buffer if the command/address value indicates a memory read operation and (ii) overwrite contents within the one of the $2^N$ independently accessible column locations within the page buffer with write data if the command/address value indicates a memory write operation.

3. The method of claim 1 wherein the plurality of bits generated within the memory component comprise a count value, the method further incrementing the count value one or more times after accessing contents within the second one of the $2^N$ independently accessible regions of the page buffer to access, in response to the command/address value, an additional one or more of the $2^N$ independently accessible regions of the page buffer.

4. The method of claim 3 wherein incrementing the count value one or more times to access the additional one or more of the $2^N$ independently accessible regions of the page buffer comprises incrementing the count value a number of times in accordance with the configuration value.

5. The method of claim 1 wherein the plurality of bits generated within the memory component comprises M bits and the fewer than N bits of the command/address value comprises N minus M bits, the method further comprising decoding, in response to a configuration value that specifies a third addressing resolution, a second composite address that includes N minus K bits of the command/address value together with K bits generated within the memory component, K being an integer less than M and not less than one.

6. The method of claim 1 wherein the integrated-circuit memory component comprises a dynamic random access memory (DRAM) cell array coupled to the page buffer, wherein the $2^N$ independently accessible regions of the page buffer comprise $2^N$ independently accessible columns of sense amplifiers, and wherein receiving the command/address value comprises receiving a column command/address value having a command code that indicates an access to an address-specified one of the $2^N$ independently accessible columns of sense amplifiers.

7. The method of claim 6 further comprising receiving, prior to receiving the column command/address value, a row command/address value and, in response, transferring to the page buffer contents from a row of DRAM cells specified by a row address component of the row command/address value.

8. The method of claim 1 wherein receiving the command/address value comprises receiving, in addition to the N bits, a plurality of bank address bits that specify one of a plurality of storage banks within the integrated-circuit memory IC, and wherein decoding the N bits of the command/address value to access contents within the first one of $2^N$ independently accessible regions of the page buffer comprises decoding the N bits of the command/address value to access contents within a first page buffer of a plurality of page buffers, the first page buffer being coupled to the one of the plurality of storage banks specified by the plurality of bank address bits.

9. The method of claim 1 wherein receiving the command/address value comprises receiving a command/address value that specifies a memory read operation, and wherein decoding N bits of the command/address value to access contents within the first one of $2^N$ independently accessible regions of the page buffer if the configuration value specifies the first addressing resolution comprises outputting the contents from the first one of the $2^N$ independently accessible regions of the page buffer from the integrated-circuit memory component in one or more M-bit wide transmissions via an M-bit data interface, and wherein decoding the first composite address to access contents within the second one of the $2^N$ independently accessible regions of the page buffer if the configuration value specifies the second addressing resolution comprises outputting the contents from the second one of the $2^N$ independently accessible regions of the page buffer from the integrated-circuit memory component in one or more M-bit wide transmissions via the M-bit data interface.

10. The method of claim 1 wherein receiving the command/address value comprises receiving (i) a command code, and (ii) a device address value that indicates whether the integrated-circuit memory device is to execute an operation indicated by the command code.

11. An integrated-circuit memory component:
a programmable register to store a configuration value;
a first page buffer having $2^N$ independently accessible regions;
a command/address interface to receive command/address value; and
access control circuitry to:
decode N bits of the command/address value to access contents within a first one of the $2^N$ independently accessible regions of the first page buffer if the configuration value specifies a first addressing resolution; and
if the configuration value specifies a second addressing resolution:
decode a first composite address that includes fewer than N bits of the command/address value together with a plurality of bits generated within the memory component to access contents within a second one of the $2^N$ independently accessible regions of the first page buffer, and
decode a second composite address that includes the fewer than N bits of the command/address value together with a plurality of bits having a fixed and predetermined state to access contents within a third one of the $2^N$ independently accessible regions of the page buffer.

12. The integrated-circuit memory component of claim 11 wherein the access control circuitry to decode N bits of the command/address value to access contents within the first one of the $2^N$ independently accessible regions of the first page buffer comprises a column-address decoder to decode N column-address bits conveyed in the command/address value to enable (i) read-out of contents within one of $2^N$ independently accessible column locations within the first page buffer if the command/address value indicates a memory read operation and (ii) overwriting of contents within the one of the $2^N$ independently accessible column locations within the first page buffer with write data if the command/address value indicates a memory write operation.

13. The integrated-circuit memory component of claim 11 wherein the plurality of bits generated within the memory component comprise a count value, and wherein the access control circuitry comprises counter circuitry to increment the count value one or more times after accessing contents within the second one of the $2^N$ independently accessible regions of the first page buffer to access, in response to the command/address value, an additional one or more of the $2^N$ independently accessible regions of the first page buffer.

14. The integrated-circuit memory component of claim 13 wherein the counter circuitry to increment the count value one or more times to access the additional one or more of the $2^N$ independently accessible regions of the first page buffer comprises circuitry to increment the count value a number of times in accordance with the configuration value.

15. The integrated-circuit memory component of claim 11 wherein the plurality of bits generated within the memory component comprises M bits and the fewer than N bits of the command/address value comprises N minus M bits, and wherein the access control circuitry is further to decode, in response to a configuration value that specifies a third addressing resolution, a second composite address that includes N minus K bits of the command/address value together with K bits generated within the memory component, K being an integer less than M and not less than one.

16. The integrated-circuit memory component of claim 11 further comprising a dynamic random access memory (DRAM) cell array coupled to the first page buffer, and wherein the $2^N$ independently accessible regions of the first page buffer comprise $2^N$ independently accessible columns of sense amplifiers, and wherein the command/address interface to receive the command/address value comprises circuitry to receive a column command/address value having a command code that indicates an access to an address-specified one of the $2^N$ independently accessible columns of sense amplifiers.

17. The integrated-circuit memory component of claim 16 further wherein the command/address interface is further to receive, prior to receiving the column command/address value, a row command/address value and wherein the access control circuitry comprises row activation circuitry to transfer to the first page buffer contents from a row of DRAM cells specified by a row address component of the row command/address value.

18. The integrated-circuit memory component of claim 11 further comprising (i) a plurality of additional page registers that include the first page register, and (ii) a first storage bank coupled to the first page register and a plurality of additional storage banks coupled respectively to the plurality of additional page registers, and wherein the command/address interface to receive the command/address value comprises circuitry to receive, in addition to the N bits, a plurality of bank address bits that indicate that the access control circuitry is to access contents within the first page buffer rather than one of the plurality of additional page buffers.

19. The integrated-circuit memory component of claim 11 further comprising an M-bit data interface to:
    output the contents from the first one of the $2^N$ independently accessible regions of the page buffer from the integrated-circuit memory component in one or more M-bit wide transmissions if the configuration value specifies the second addressing resolution; and
    output the contents from the second one of the $2^N$ independently accessible regions of the page buffer from the integrated-circuit memory component in one or more M-bit wide transmissions if the configuration value specifies the second addressing resolution.

20. An integrated-circuit memory component comprising:
    a page buffer having $2^N$ independently accessible regions;
    means for storing a configuration value;
    means for receiving command/address value; and
    means for:
        decoding N bits of the command/address value to access contents within a first one of the $2^N$ independently accessible regions of the page buffer if the configuration value specifies a first addressing resolution; and
        if the configuration value specifies a second addressing resolution:
        decoding a first composite address that includes fewer than N bits of the command/address value together with a plurality of bits generated within the memory component to access contents within a second one of the $2^N$ independently accessible regions of the page buffer, and
        decoding a second composite address that includes the fewer than N bits of the command/address value together with a plurality of bits having a fixed and predetermined state to access contents within a third one of the $2^N$ independently accessible regions of the page buffer.

* * * * *